(12) United States Patent
Hsu

(10) Patent No.: US 6,589,712 B1
(45) Date of Patent: *Jul. 8, 2003

(54) METHOD FOR FORMING A PASSIVATION LAYER USING POLYIMIDE LAYER AS A MASK

(76) Inventor: Yi-Ren Hsu, No.9, Creation Rd.1, Science-Based Industrial Park, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/186,262

(22) Filed: Nov. 4, 1998

(51) Int. Cl.⁷ .............................. G03C 5/00; B44C 1/22
(52) U.S. Cl. ................. 430/313; 430/315; 430/316; 430/317; 430/961; 216/41
(58) Field of Search ................. 430/313, 315, 430/316, 317, 961; 216/41

(56) References Cited

U.S. PATENT DOCUMENTS

| | | | | |
|---|---|---|---|---|
| 4,606,998 A | * | 8/1986 | Clodgo et al. | 430/312 |
| 4,614,666 A | * | 9/1986 | Lindenfelser | 427/39 |
| 5,217,926 A | * | 6/1993 | Langley | 437/228 |
| 5,775,569 A | * | 7/1998 | Berger et al. | 228/254 |
| 5,780,105 A | * | 7/1998 | Wang | 427/240 |
| 5,792,680 A | * | 8/1998 | Sung et al. | 438/210 |
| 6,010,918 A | * | 1/2000 | Marino et al. | 438/20 |
| 6,054,340 A | * | 4/2000 | Mitchell et al. | 438/132 |

* cited by examiner

Primary Examiner—Steven P. Griffin
Assistant Examiner—Jonas N. Strickland

(57) ABSTRACT

A method for forming a passivation coating on a semiconductor wafer. The method comprises: forming a silicon dioxide layer on the semiconductor wafer, forming a silicon nitride layer on the silicon dioxide layer; forming a polyimide layer on the silicon nitride layer; patterning and etching the polyimide layer to expose a portion of the silicon nitride layer according to a first photomask; and etching the silicon dioxide layer and the exposed silicon nitride layer to expose the fuse, the fuse window and the metal layer, the silicon dioxide layer and the silicon nitride layer being etched by an anisotropic etching step using the patterned polyimide layer as a mask.

6 Claims, 8 Drawing Sheets

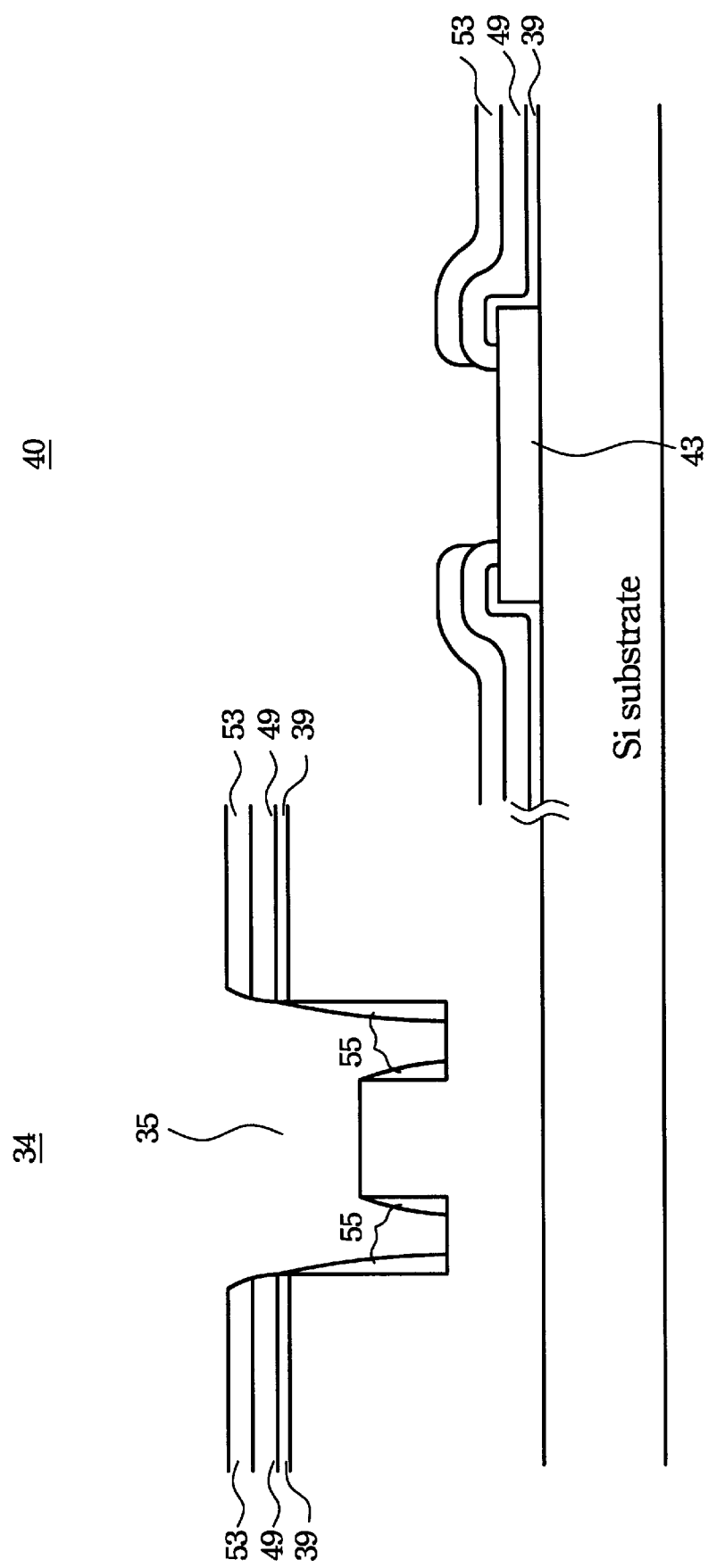

METHOD FOR FORMING A PASSIVATION LAYER USING POLYIMIDE LAYER AS A MASK

TECHNICAL FIELD OF THE INVENTION

This invention relates to a method for forming a passivation layer, and more particularly, to a method for forming a passivation layer using a polyimide layer as a mask.

BACKGROUND OF THE INVENTION

A passivation layer seals the underlying device structures from contaminants and moisture and also serves as a scratch protection layer. In fabricating a memory cell, a passivation layer such as CVD PSG or plasma enhanced CVD silicon nitride is deposited over the entire surface of the wafer to protect the devices in the wafer. In general, it is desirable to form a thick passivation layer, since a thicker passivation layer will provide better protection.

As shown in FIG. 1A, a cross sectional view of a typical wafer with a memory cell is shown with a protruding fuse. The oxide layer 3 in the periphery area 4 on the silicon substrate is etched to form the fuse window 5. A poly fuse 7 is formed in the fuse window 5. A silicon dioxide layer 9 is formed in both the periphery area 4 and the bonding pad area 10. The silicon dioxide layer 9 is used as a buffer layer to prevent the metal layer 13 from directly contacting a subsequently formed silicon nitride layer.

The silicon dioxide layer 9 covers the metal layer 13 on the silicon substrate in the bonding pad area 10. By using a first photomask (not shown), a first photoresist layer 15 on the periphery area 4 and the bonding pad area 10 is developed. A portion of the silicon dioxide layer 9 in the fuse window 5 and on the metal layer 13 is removed using the developed first photoresist layer 15 as a mask.

Referring to FIG. 1B, the first photoresist layer 15 is removed and a silicon nitride layer 19 is formed. Thus, the exposed metal layer 13 in the bonding pad area 10 and the periphery area 4 are covered by the silicon nitride layer 19. Next, by utilizing a second photomask (not shown), a second photoresist layer 21 on the bonding pad area 10 and on the periphery area 4 is developed. Then a portion of the silicon nitride layer 19 underlying the metal layer 13 is exposed, and the exposed silicon nitride layer 19 is etched. The silicon nitride layer 19 is used as a passivation layer to protect the devices and the poly fuse 7 in the semiconductor wafer from moisture and containment.

Referring to FIG. 1C, the second photoresist layer 21 is removed and a polyimide layer 23 is formed on the bonding pad area 10 and the periphery area 4. Subsequently, a third photomask (not shown) is used to pattern the polyimide layer 23. Then a curing step is used to increase the density of the polyimide layer 23, shrinking the polyimide layer 23 to expose a portion of the fuse window 5 and a portion of metal layer 13. The cured polyimide layer 23 serves as further passivation to prevent the attack of the alpha particle.

The oxide layer, the silicon nitride layer, and the polyimide layer are all used to serve as the passivation layer of the semiconductor wafer. Therefore, it is necessary to use three photomasks to form the passivation layer of the semiconductor wafer. This is expensive and inefficient.

What is needed is a simpler passivation method.

SUMMARY OF THE INVENTION

A method for forming a passivation coating on a semiconductor wafer is disclosed. The method comprises: forming a silicon dioxide layer on said semiconductor wafer, said semiconductor wafer comprising a first area and a second area, said first area comprising a fuse, a semiconductor device, and an oxide layer, said oxide layer comprising a fuse window, said fuse being at a bottom of a fuse window, said second area comprising a bonding pad, said bonding pad comprising a metal layer, a spin on glass (SOG) being used in fabricating said semiconductor device; patterning and etching said silicon dioxide layer to expose said fuse window and said metal layer according to a first photomask; forming a silicon nitride layer on said silicon dioxide layer, said fuse window, and said metal layer; forming a polyimide layer on said silicon nitride layer; patterning said polyimide layer according to a second photomask; and etching said silicon nitride layer to form a spacer on a side wall of said fuse and said fuse window, and to expose said metal layer, said silicon nitride layer being etched by an anisotropic etching using said patterned polyimide layer as a mask.

BRIEF DESCRIPTION OF THE DRAWINGS

The above features of the present invention will be more clearly understood from consideration of the following descriptions in connection with accompanying drawings in which:

FIGS. 2A–2C illustrate cross sectional views of a semiconductor wafer during formation of a passivation layer according to one preferred embodiment of the present invention.

DESCRIPTION OF THE PREFERRED EMBODIMENT

Figure 1A:
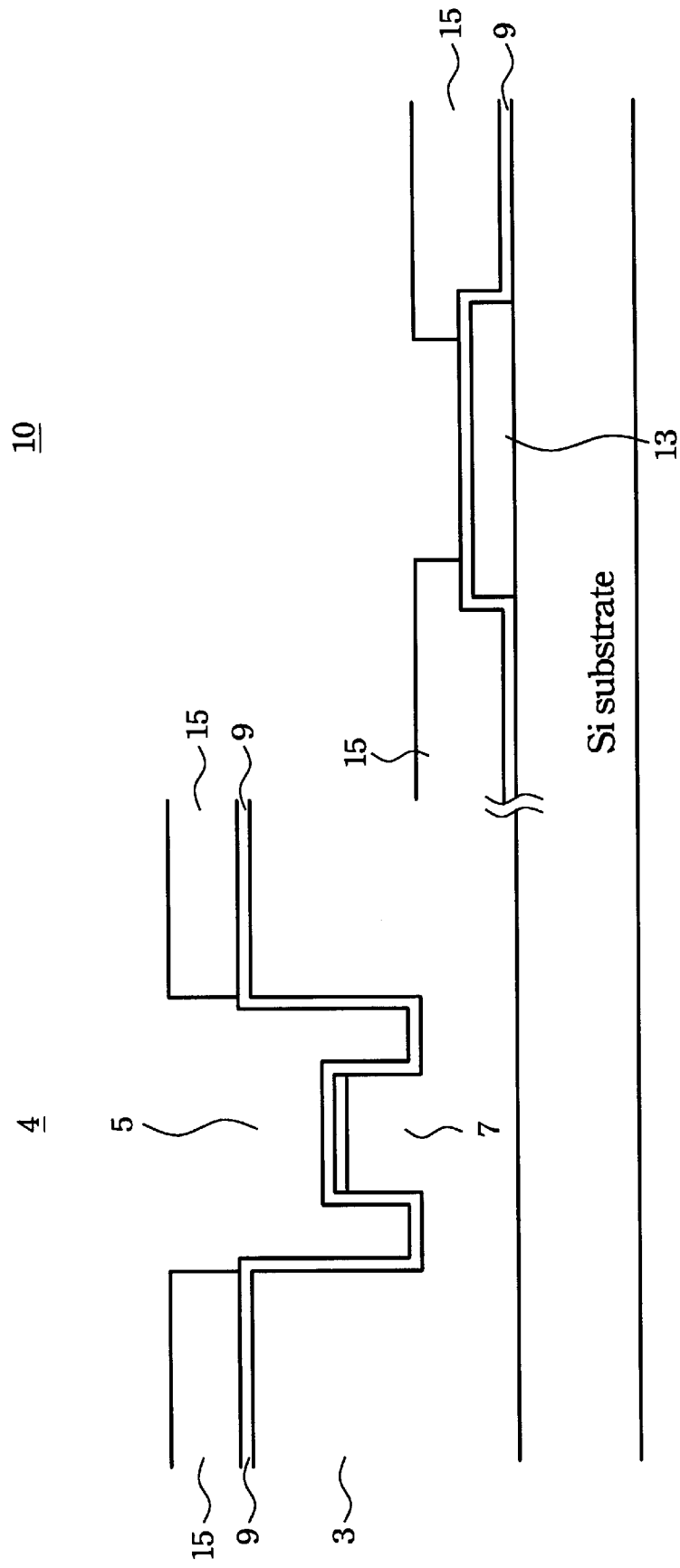
FIGS. 1A–1C illustrate cross sectional views showing a prior art passivation technique.
Figure 1B:
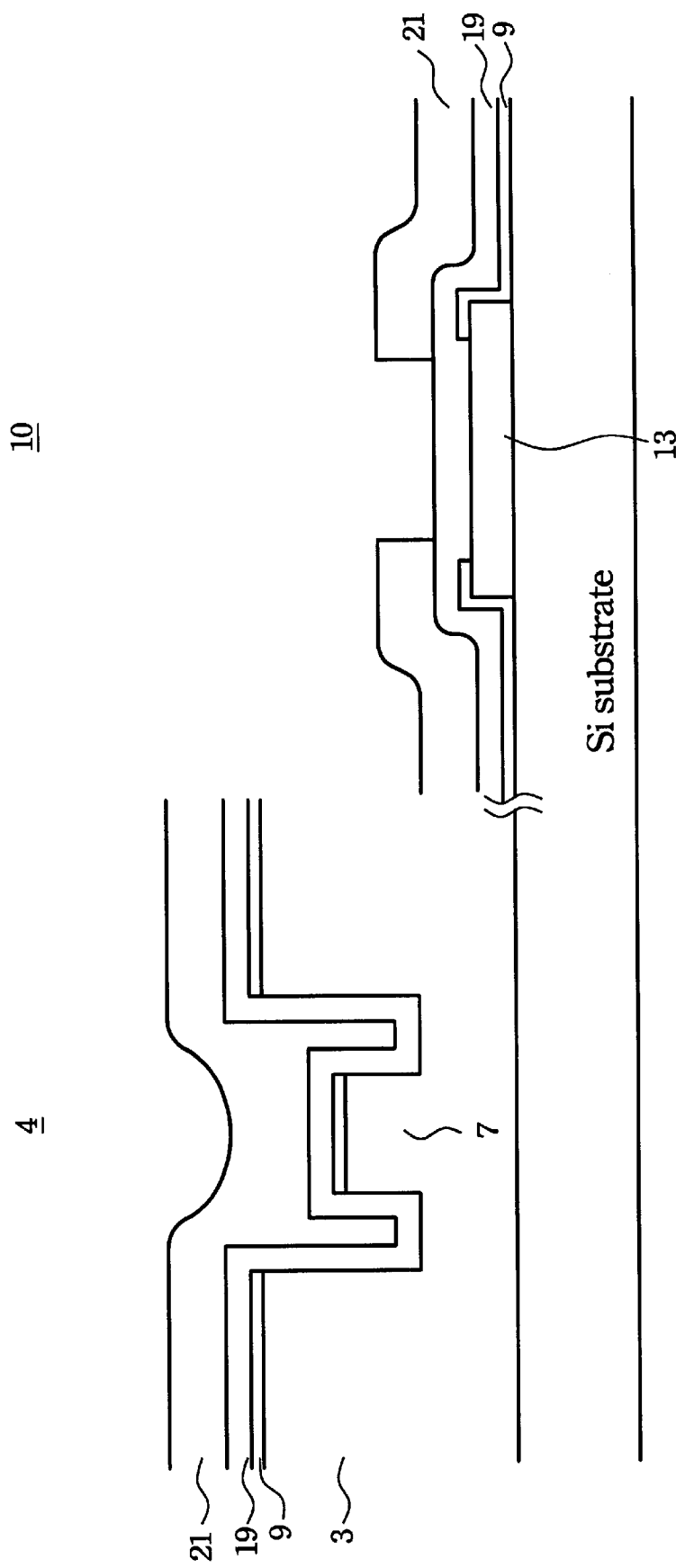
Figure 1C:
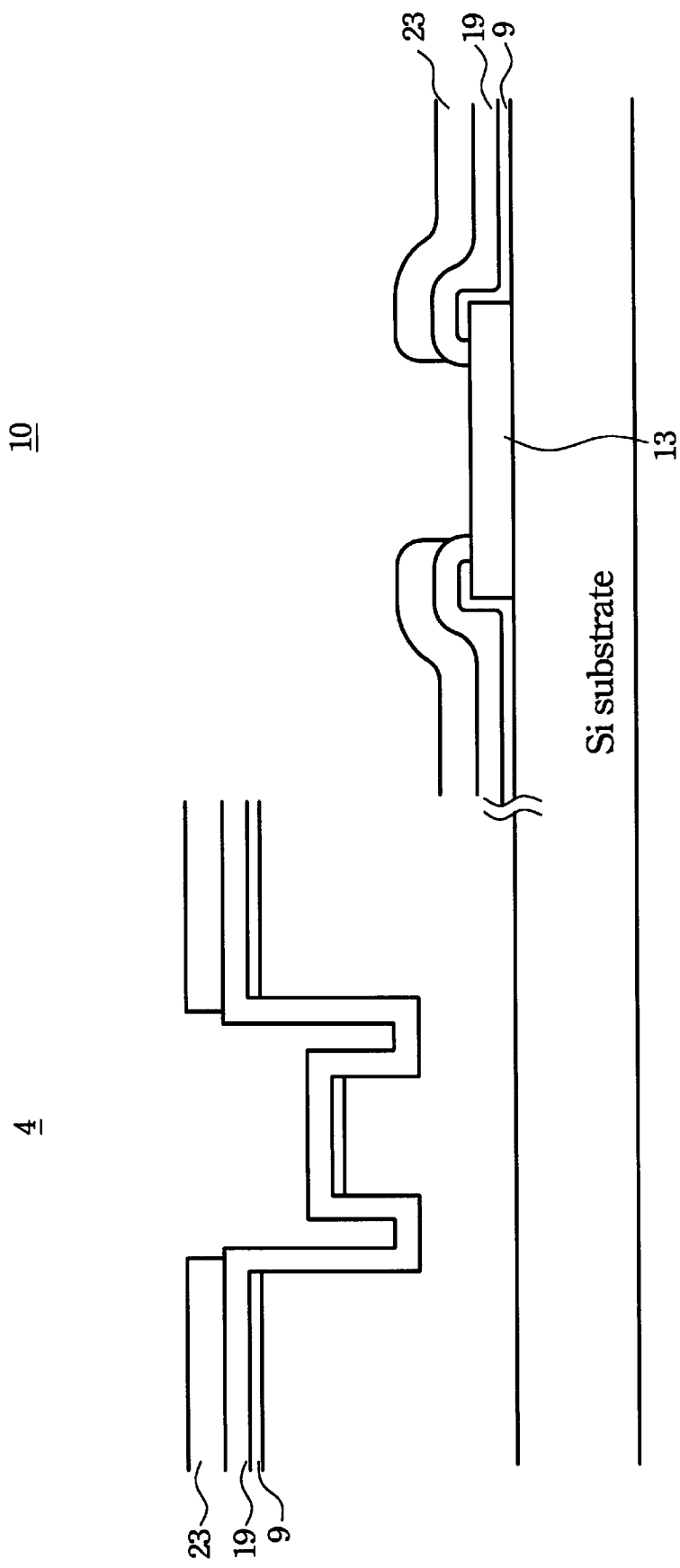
Figure 2A:
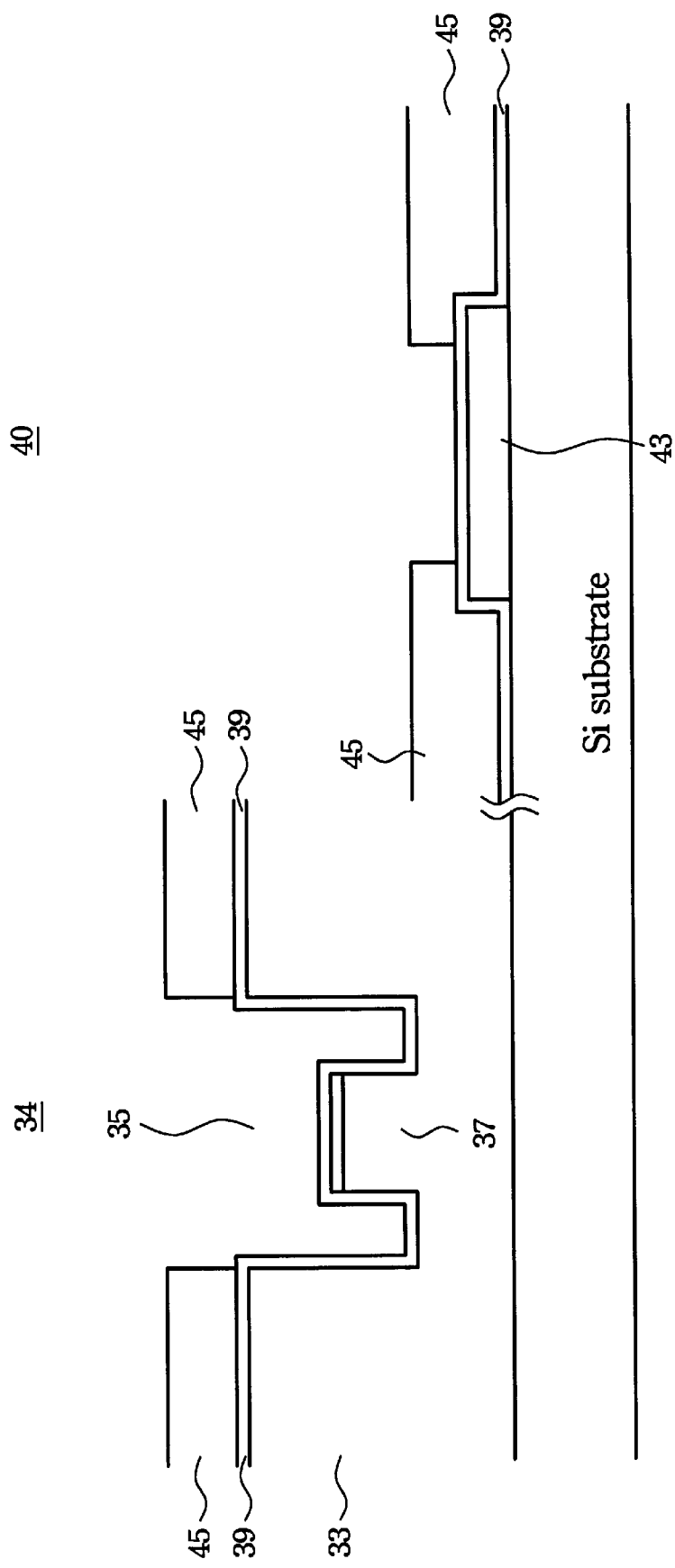

The present invention provides a method for fabricating a passivation layer of a semiconductor wafer using a reduced number of masks. The method according to the preferred embodiment of the present invention uses only two photomasks to fabricate the passivation layer. The cross sectional view of the wafer processed by the method according to the preferred embodiment of the present invention is shown in FIG. 2A.

An oxide layer 33 in the periphery area 34 on a silicon substrate is etched to form a fuse window 35. A poly fuse 37 is formed at the bottom of the fuse window 35. Then a silicon dioxide layer 39 is formed over both the periphery area 34 and a bonding pad area 40. The silicon dioxide layer 39 serves as a buffer layer to prevent the metal layer 43 from directly contacting a second subsequent dielectric layer.

Utilizing a first photomask (not shown), a first photoresist layer 45 is formed and developed on the periphery area 34 and the bonding pad area 40.

Figure 2B:
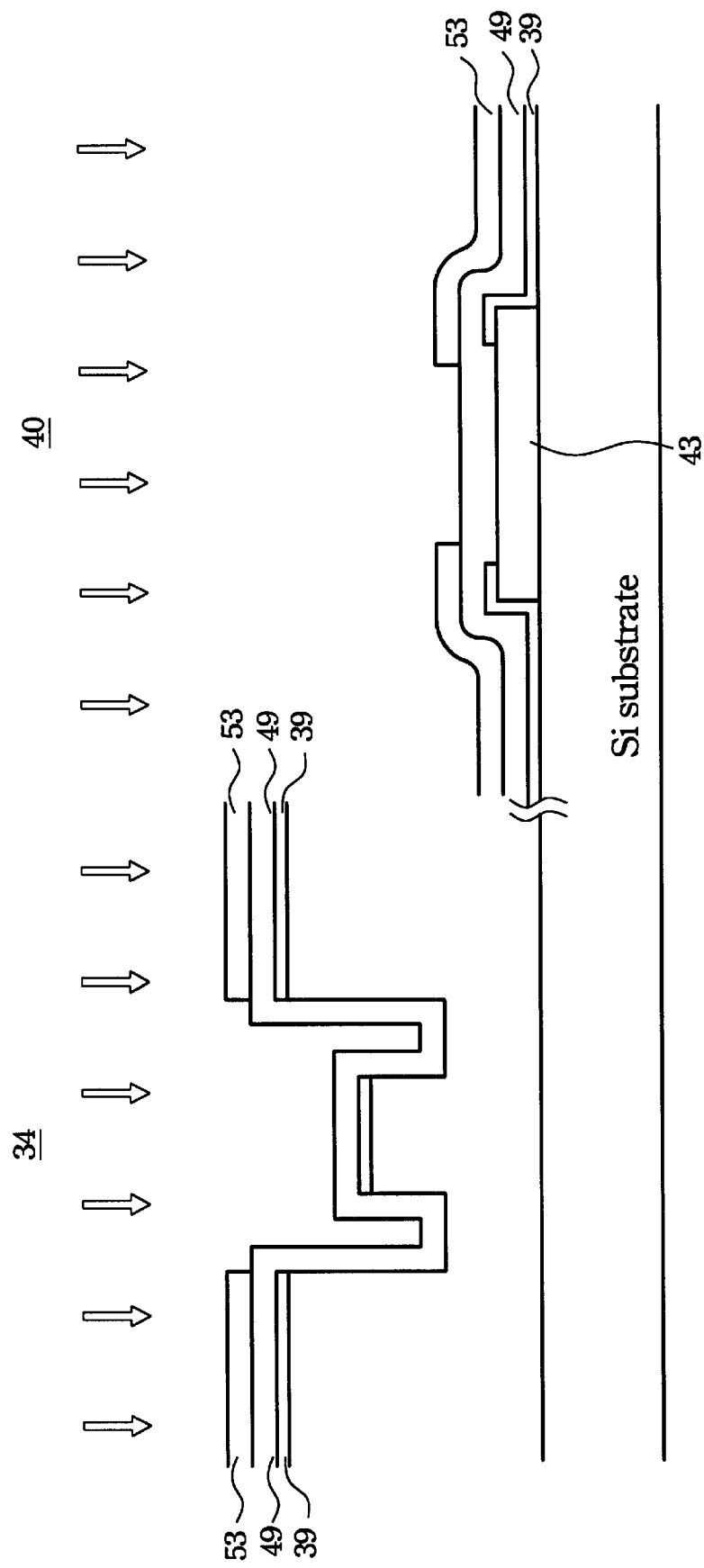

Referring to FIG. 2B, the developed first photoresist layer 45 is removed and then a second dielectric layer 49 is formed on the topography of the wafer. The second dielectric layer 49 in one preferred embodiment of the present invention can be made of silicon nitride (SiNx) to about 7000 angstroms thick. Therefore, the side wall of the fuse window 35 and the surface of the poly fuse 37 are covered by the second dielectric layer 49. Subsequently, a third dielectric layer 53 is formed on the topography of the semiconductor wafer.

A second photomask (not shown) is used to pattern the third dielectric layer 53. Thus, a portion of the second dielectric layer 49 is exposed. The next step is a curing step that is used to increase the density of the third dielectric layer 53 by evaporating the organic solvent contained in the third dielectric layer 53. Thus, the third dielectric layer 53 shrinks after the curing step, and more of the second dielectric layer 49 is exposed. The second dielectric layer 49 serves as a passivation layer to protect both the devices and the poly fuse 37 in the semiconductor wafer from moisture and contamination. The third dielectric layer 53 can be a polyimide layer, which is about 5 microns in thickness in one preferred embodiment of the present invention.

The periphery area 34 includes the oxide layer 33 adjacent to a semiconductor device, the fuse window 35, and the poly fuse 37. The bonding pad area 40 includes a bonding pad (not shown), and the bonding pad includes the metal layer 43.

Referring to FIG. 2C, the next step is an anisotropic etching step using the cured third dielectric layer 53 as a mask to etch the exposed second dielectric layer 49. When the second dielectric layer 49 is made of silicon nitride, the etchant used to etch the second dielectric layer 49 can be one of the following: CF4+O2, CHF3, C2F6, and SF6+He. Because the etching step mentioned above is anisotropic, the second dielectric layer 49 on the side wall of the fuse window 35 remains, and thus spacers 55 are formed on the side wall of the fuse window 35 and the poly fuse 37. If the second dielectric layer 49 is made of silicon nitride, the spacer 55 is also made of silicon nitride. Thus, the passivation layer of the semiconductor wafer is finished, and it is noted that only two photomasks are used in fabricating the passivation layer.

The spacers 55 can protect the semiconductor wafer from moisture and contaminate, so even if the SOG is used in the planarization process, the passivation layer of the semiconductor wafer can protect the semiconductor wafer. The silicon dioxide layer, the silicon nitride layer, together with the polyimide layer serve as the passivation layer of the semiconductor wafer, and only two photomasks are used to form the passivation layer of the semiconductor wafer.

Figure 3A:
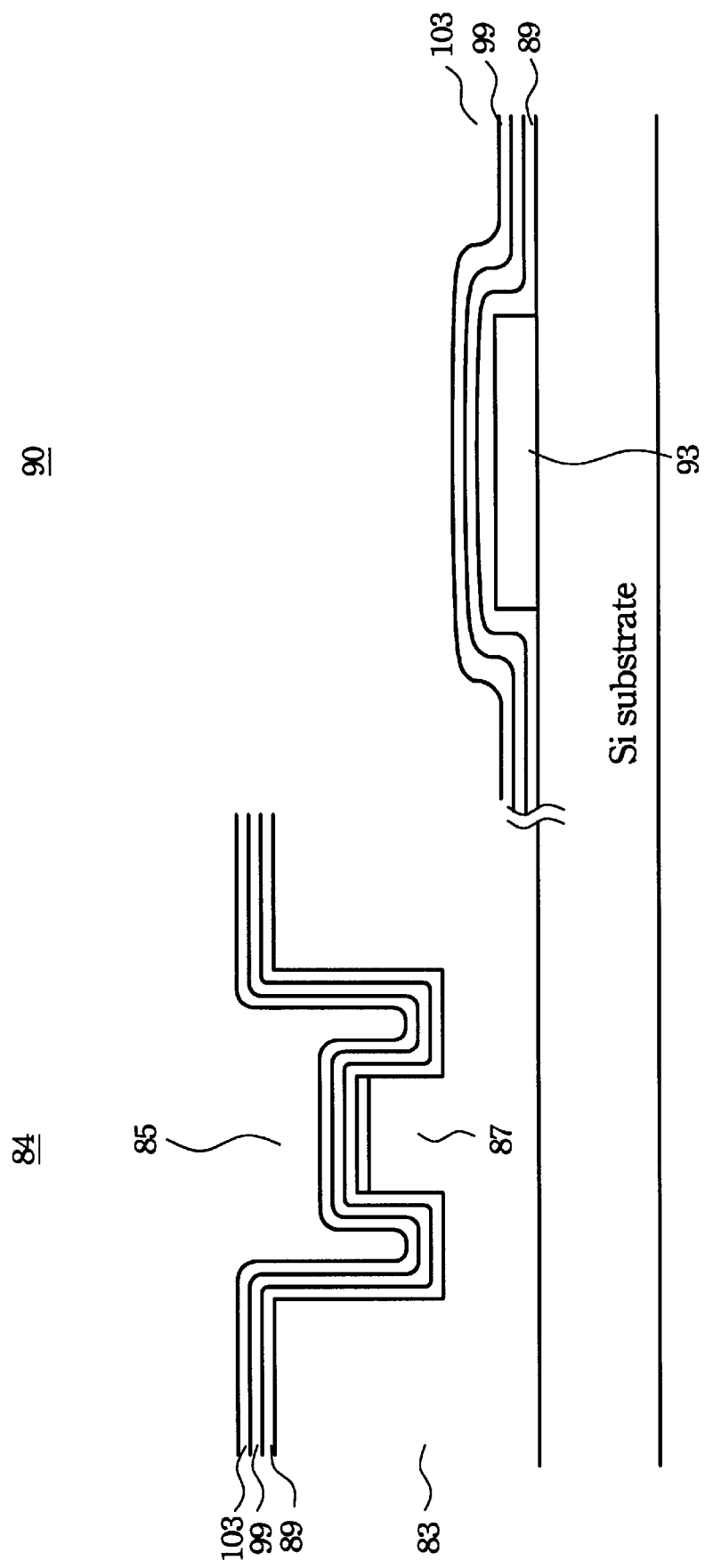
FIGS. 3A–3B illustrate cross sectional views of a semiconductor wafer during formation of a passivation layer according to an alternative embodiment of the present invention.
Figure 3B:
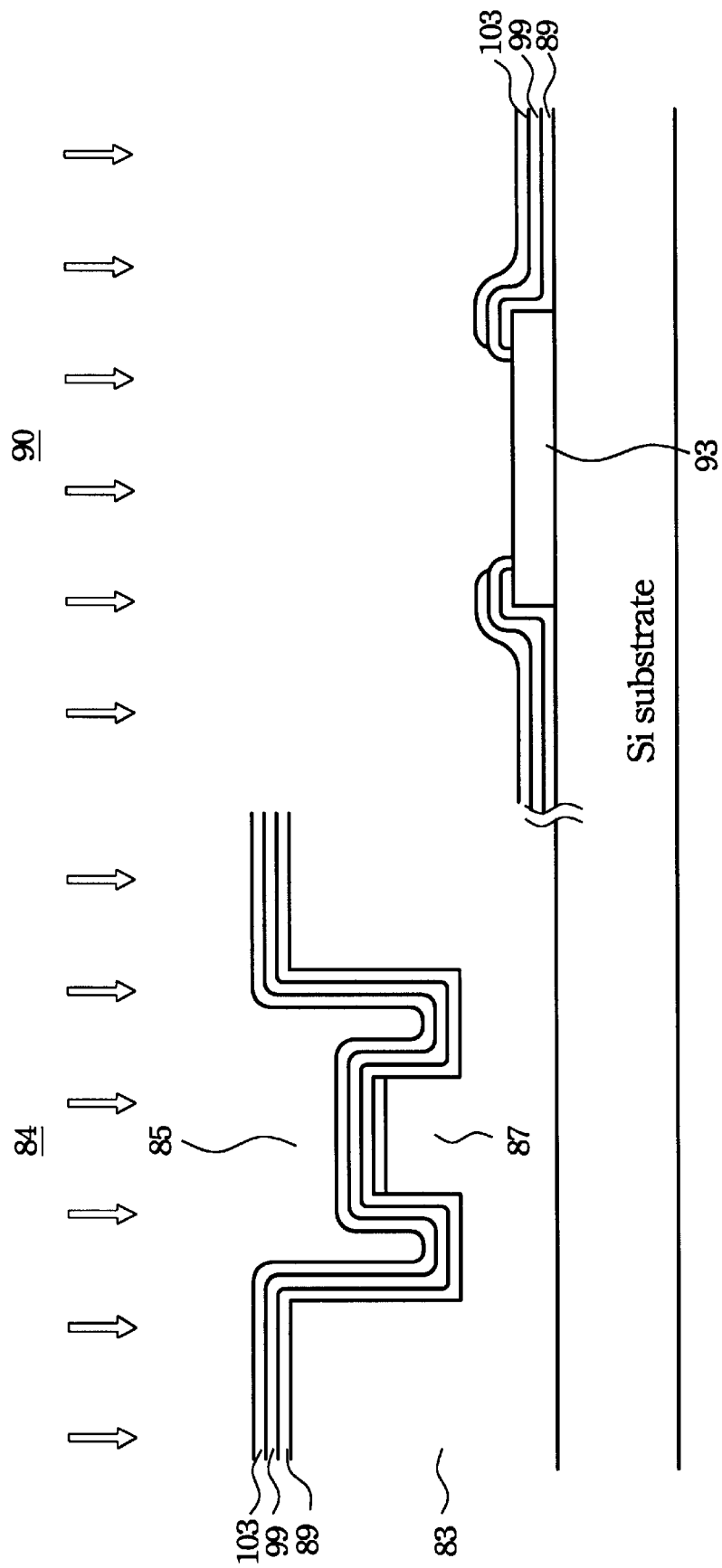

In an alternative embodiment, only one photomask is needed to fabricate the passivation layer. Referring to FIG. 3A, an oxide layer 83 in a periphery area 84 is etched to form a fuse window 85. A poly fuse 87 is formed at the bottom of the fuse window 85. Then, a silicon dioxide layer 89 is formed over both the periphery area 84 and the bonding pad area 90. The silicon dioxide layer 89 in the periphery area 84 is formed on the etched oxide layer 83 and the poly fuse 87. The silicon dioxide layer 89 serves as a buffer layer to prevent the metal layer 93 from directly contacting a second subsequent dielectric layer. The thickness of the silicon dioxide layer 89 is about 2000 angstroms.

A second dielectric layer 99 is formed on the silicon dioxide layer 89. The second dielectric layer 99 can be made of silicon nitride (SiNx) to a thickness of about 7000 angstroms. Thus, the side wall of the fuse window 85 and the surface of the poly fuse 87 are covered by the second dielectric layer 89. Subsequently, a third dielectric layer 103 is formed on the second dielectric layer 89.

A photomask (not shown) is used to pattern the third dielectric layer 103. Thus, a portion of the second dielectric layer 99 is exposed. Next, a curing step is used to increase the density of the third dielectric layer 103 by evaporating the organic solvent contained in the third dielectric layer 103. The patterned third dielectric layer 103 shrinks after the curing step, and more of the second dielectric layer 99 is exposed. The third dielectric layer 103 can be a polyimide layer, which is about 5 microns in thickness.

The next step is an anisotropic etching step using the cured third dielectric layer 103 as a mask to etch the exposed second dielectric layer 99 and the first dielectric layer 89. If the second dielectric layer 99 is made of silicon nitride, and the first dielectric layer 89 is made of silicon dioxide, the etchant used to etch the second dielectric layer 99 can be one of the following: CF4+O2, CHF3, C2F6, and SF6+He, and the etchant used to etch the first dielectric layer can be can be one of the following: CF4+O2, CHF3, and C2F6. Because the first dielectric layer 89 in the first preferred embodiment of the present invention must be thoroughly removed, the second dielectric layer 99 is thoroughly removed also. Thus, the second dielectric layer 99 and the first dielectric layer 89 on the side wall of the fuse window 85 are removed.

It is noted that only one photomask is used in fabricating the passivation layer of the semiconductor wafer according to the preferred embodiment of the present invention. The method according to the preferred embodiment of the present invention can be used when there is no attracter of moisture used in fabricating the semiconductor wafer. For example, if SOG is not used in the planarization process, the alternative embodiment of the present invention can be used to form the passivation layer of the semiconductor wafer.

The silicon dioxide layer, the silicon nitride layer, and the polyimide layer serve as the passivation layer of the semiconductor wafer, and only one photomask is used in forming the passivation layer.

As will be understood by persons skilled in the art, the foregoing preferred embodiment of the present invention is illustrative of the present invention rather than limiting the present invention. While the preferred embodiment of the invention has been illustrated and described, it will be appreciated that various changes can be made therein without departing from the spirit and scope of the invention.

What is claimed is:

1. A method for forming a passivation coating on a semiconductor wafer comprising:

forming a first dielectric layer on said semiconductor wafer, said semiconductor wafer comprising a first area and a second area, said first area comprising a fuse, a semiconductor device, and an oxide layer, said oxide layer comprising a fuse window, said fuse being at the bottom of said fuse window, said second area comprising a bonding pad, said bonding pad comprising a metal layer;

patterning and etching said first dielectric layer to expose said fuse window and said metal layer according to a first photomask;

forming a second dielectric layer on said first dielectric layer, said fuse window, and said metal layer;

forming a third dielectric layer made of polyimide on said second dielectric layer, wherein said polyimide is a negative photoresist having a thickness of about 5 microns;

patterning said third dielectric layer by exposing said third dielectric layer through a second photomask using a photolithographic tool, to form a polyimide pattern exposing a portion of said second dielectric layer; and etching said exposed portion of said second dielectric layer to form a spacer on a side wall of said fuse and said fuse window, and to expose said metal layer, said second dielectric layer being etched by an anisotropic etching step using said polyimide pattern as a mask, said passivation coating on said semiconductor wafer being thus fabricated by etching said first dielectric layer, said second dielectric layer, and said third dielectric layer according to said first photomask and said second photomask.

2. The method as claim 1, wherein said first dielectric layer is made of silicon dioxide.

3. The method as claim 1, wherein said semiconductor wafer uses spin on glass (SOG).

4. The method as claim 1, wherein said second dielectric layer is made of silicon nitride.

5. A method for forming a multi-layered passivation on a wafer, the method comprising:

sequentially forming a silicon oxide layer, a silicon nitride layer and a polyimide layer on a substrate, wherein the polyimide layer is a negative photoresist having a thickness of about 5 microns;

forming a polyimide pattern serving as a photoresist pattern on the silicon nitride layer, by exposing the polyimide layer through a photomask using a photolithographic tool; and etching the silicon nitride layer and the silicon oxide layer by using the photoresist pattern as a mask, whereby the polyimide pattern, the etched silicon nitride layer and the etched silicon oxide layer collectively serve as a multi-layered passivation.

6. A method for forming a multi-layered passivation on a wafer, the method comprising:

forming a silicon oxide pattern on a substrate;

sequentially forming a silicon nitride layer and a polyimide layer on the silicon oxide pattern, wherein the polyimide layer is a negative photoresist having a thickness of about 5 microns;

forming a polyimide pattern serving as a photoresist pattern on the silicon nitride layer, by exposing the polyimide layer through a photomask using a photolithographic tool; and etching the silicon nitride layer by using the photoresist pattern as a mask, whereby the polyimide pattern, the etched silicon nitride layer and the silicon oxide pattern collectively serve as a multi-layered passivation.

* * * * *